United States Patent [19]
Saito

[11] Patent Number: 5,492,735
[45] Date of Patent: Feb. 20, 1996

[54] PROCESS FOR PLASMA DEPOSITION

[75] Inventor: Masaki Saito, Kanagawa, Japan

[73] Assignee: Sony Corporation, Tokyo, Japan

[21] Appl. No.: 294,409

[22] Filed: Aug. 23, 1994

[30] Foreign Application Priority Data

Aug. 31, 1993 [JP] Japan .................................. 5-238909

[51] Int. Cl.⁶ ...................................... B05D 3/06
[52] U.S. Cl. .................... 427/569; 427/255.3; 427/255.7; 427/402; 427/534; 427/535; 427/579; 427/585
[58] Field of Search ...................................... 427/534, 535, 427/569, 248.1, 402, 255.7, 255.3, 585, 579

Primary Examiner—Bernard Pianalto
Attorney, Agent, or Firm—Hill, Steadman & Simpson

[57] ABSTRACT

A process for plasma deposition is disclosed, which permits increasing the plasma deposition processing capacity.

In a single substrate processing plasma CVD apparatus, chamber plasma cleaning II is done once for every plural deposition cycles I. If necessary, for each deposition cycle the intensity of the electric field applied between pair electrodes is varied (for instance, increased to an extent corresponding to the deposition capacity reduction).

3 Claims, 7 Drawing Sheets

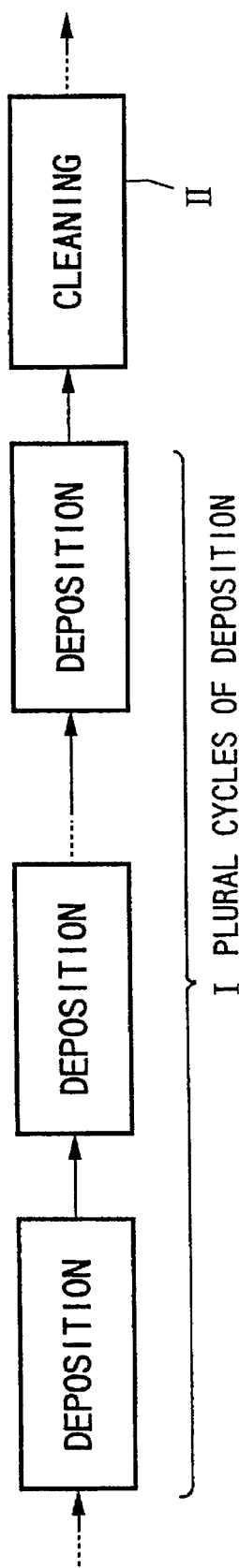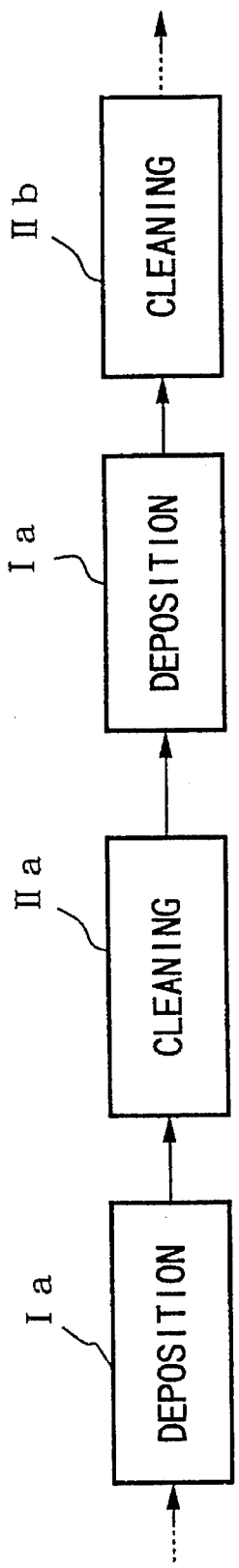

NUMBER OF DEPOSITION CYCLES

NUMBER OF DEPOSITION CYCLES

PROCESS FOR PLASMA DEPOSITION

BACKGROUND OF THE INVENTION

This invention relates to a process for plasma deposition and a plasma CVD apparatus, specifically a single substrate processing plasma CVD apparatus. The invention is applicable to, for instance, a plasma CVD process or the like for film formation to form an electronic material for a semiconductor device or the like.

In the prior art single substrate processing plasma CVD apparatus, chamber plasma cleaning is done once right after each deposition cycle. This is shown in FIG. 2. As shown, cleaning IIa is done right after a deposition cycle Ia, and cealing IIb is done again right after the next deposition cycle Ib.

This is done so because during the deposition CVD films are formed on the electrodes as well. If a deposition cycle is done right after the preceding cycle, i.e., without cleaning the chamber after the preceding cycle, the intensity of the electric field between applied between electrodes is reduced compared to the value in the preceding cycle, thus leading to non-unifrmity of the thickness of the CVD film and quality (etching rate, stress, etc.) thereof. For this reason, right after a deposition cycle the chamber is plasma cleaned once to remove CVD films formed on the electrodes. In the prior art, however, the time that is required for the cleaning sequence increases the total processing time and thus reduces the processing capacity of the apparatus.

It may be thought that if there is an adequate power meter which can reliably monitor the effective inter-electrode power, continuous deposition may be possible even in the prior art because it is possible to provide an adequate high frequency output at an adequate timing and thus make the electric field between the electrodes constant. Actually, however, the impedance including the electrodes, particularly plasma impedance, subsequent to an impedance matching unit in high frequency circuit, is varied complicatedly due to such causes as gas pressure, contamination of the chamber, CVD film deposition on the electrodes, etc. For this reason, up to date there is no power meter which can monitor the effective power accurately and instantly. Therefore, in the prior art method it is difficult to control the inter-electrode effective power, thus making the cleaning for each deposition cycle necessary.

SUMMARY OF THE INVENTION

An object of the invention which has been intended in view of the above problems in the prior art method, is to provide a method of plasma deposition, which permits increasing the plasma deposition capacity.

To attain the above object of the invention, there is provided a process for plasma deposition, which uses a single substrate processing plasma CVD apparatus having a chamber accommodating an upper electrode and a lower electrode facing the upper electrode and supporting a substrate and comprises the steps of performing at least two deposition cycles to form a CVD film on each substrate, the intensity of the electric field applied between the electrodes being changed for each deposition cycle, and plasma cleaning the chamber after the deposition cycles.

In the process, the intensity of the electric field is increased according to the thickness of film deposited on the upper electrode.

Further, in the process the distance between the upper and lower electrodes is reduced according to the thickness of film deposited on the upper electrode.

According to the invention, there is further provided a single substrate processing plasma CVD apparatus, which comprises a chamber, a pair of electrodes disposed in the chamber, one of the electrodes supporting a substrate, means for generating an electric field between the pair of electrodes, and means for correcting the itensity of the electric field for each depositon cycle.

In the apparatus, the electric field correcting means is for varying the distance between the two electrodes.

According to the invention, a single substrate processing plasma CVD process is carried out such that chamber plasma cleaning is done once for a plurality of deposition cycles.

In this process, the electric field between the two electrodes may be varied, i.e., increased to an extent corresponding to deposition capacity reduction.

In case of films which can be formed without being influenced by the electric field density for instance a $SiO_2$ type film with a thickness of about 3,000 angstroms, it is possible by varying the electric field intensity to permit cleaning to be done only once for a plurality of deposition cyclces. In case when the film formation is related to the electric field density, the electric field may be varied in a setting such that the the film quality is not changed.

Since according to the invention the chamber plasma cleaning can be done only once for a plurality of deposition cyclces, it is possible to reduce the cleaning frequency in the prior art process sequence, in which chamber plasma cleaning is done once right after each deposition cycle. It is thus possible to greatly improve the processing capacity of the single substrate processing plasma CVD apparatus.

Further, since according to the invention the intensity of the electric field between the electrodes is varied for each deposition cycle, it is possible to readily and adequately make up for the inter-electrode electric field intensity reduction due to film deposition on the electrodes during the deposition. Thus, the next deposition cycle can be continuously carried out without resulting in non-uniformity of the thickness and quality of ther film, such as etching rate, stress, etc. It is thus possible to more effectively realize the invention as claimed in claim 1.

BRIEF DESCRIPTION OF THE DRAWINGS

FIG. 1 is a view showing a process sequence of a single substrate processing plasma CVD apparatus according to the invention;

FIG. 2 is a view showing a process sequence of a single substrate processing plasma CVD apparatus in the prior art;

DETAILED DESCRIPTION OF THE PREFERRED EMBODIMENTS

Now, embodiments of the invention will be described with reference to the drawings. It is of course to be understood that the embodiments are by no means limitative of the invention.

EMBODIMENT 1

In this embodiment, the invention is applied to a single substrate processing plasma CVD process.

As shown in the process sequence shown in FIG. 1, in this embodiment cleaning II is done once for a plurality of deposition cycles I. With this process sequence, the processing capacity could be greatly improved.

Figure 3:
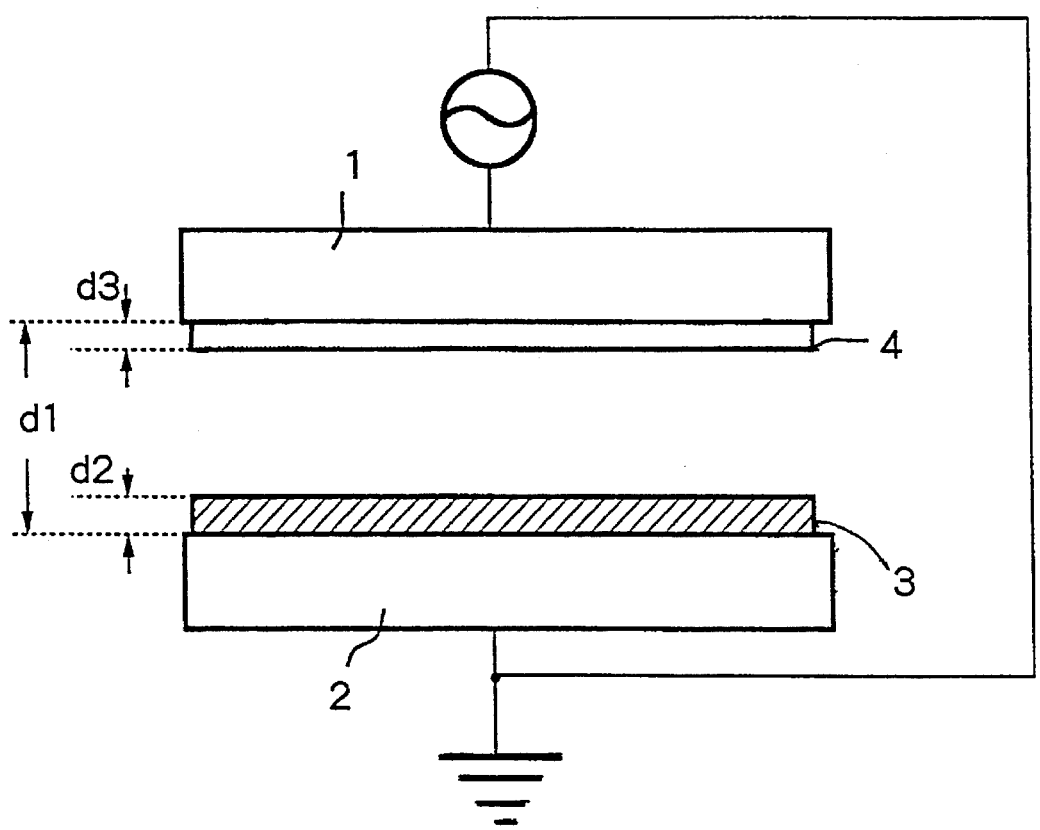
FIG. 3 is a view showing the concept underlying the single substrate processing plasma CVD apparatus according to the invention.
Figure 4:
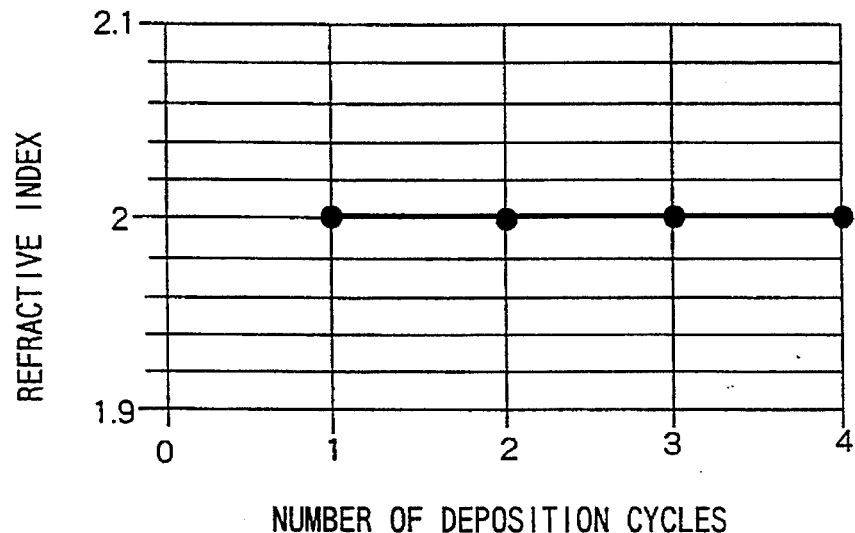
FIG. 4 is a view showing the relation between refractive index and number of deposition cycles in an embodiment of the invention.
Figure 5:
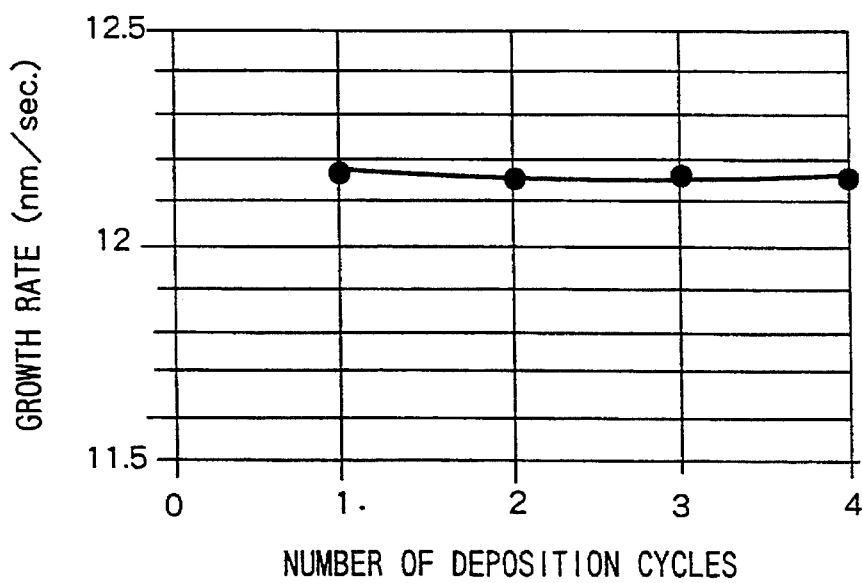
FIG. 5 is a view showing the relation between growth rate and number of deposition cycles in the embodiment.
Figure 6:
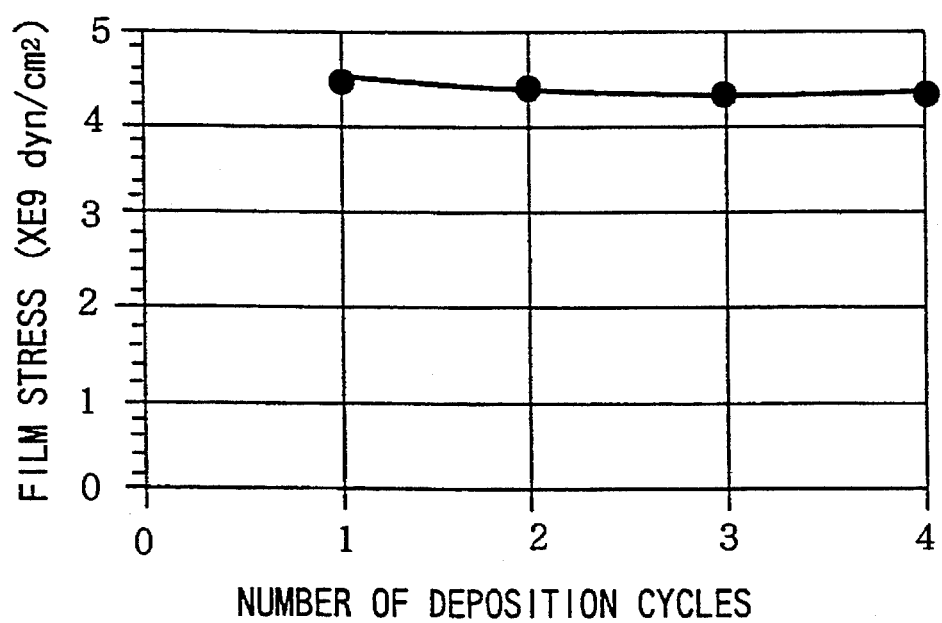
FIG. 6 is a view showing the relation between film stress and number of deposition cycles in the embodiment.
Figure 7:
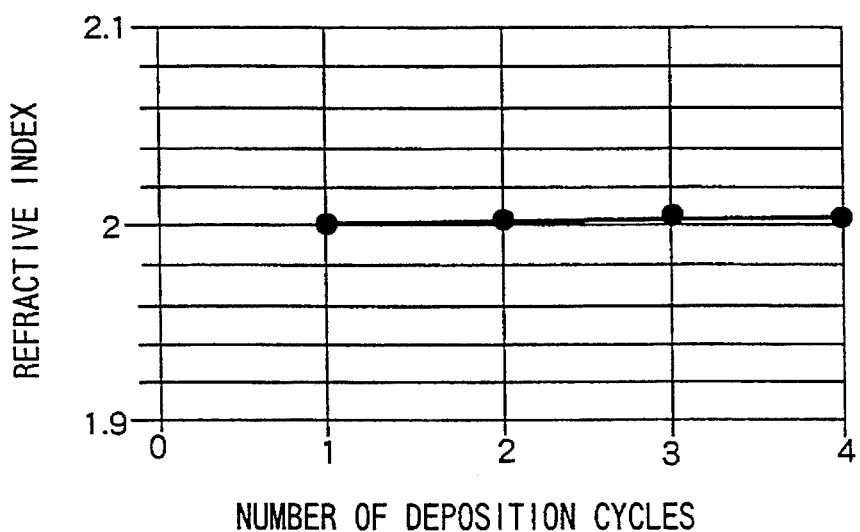
FIG. 7 is a view showing the relation between refractive index and number of deposition cycles in a prior art example.
Figure 8:
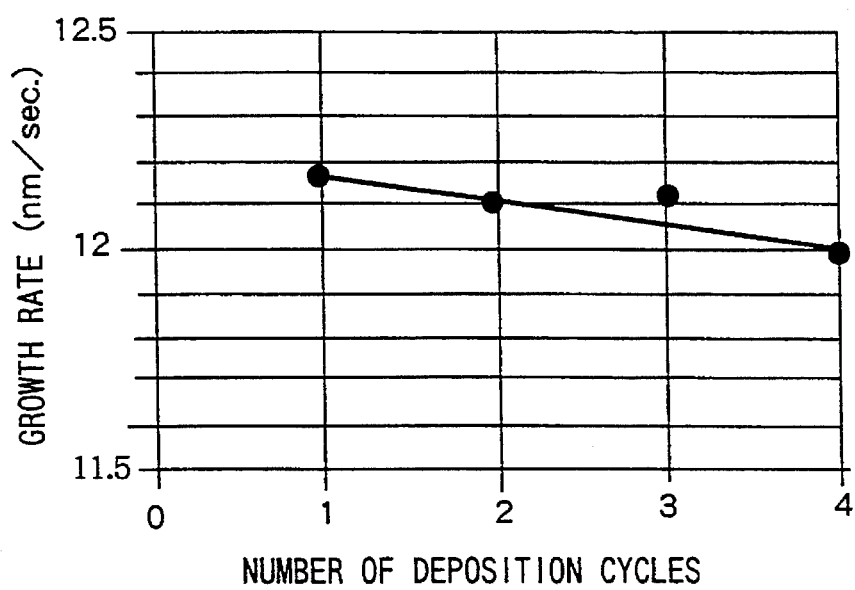
FIG. 8 is a view showing the relation between growth rate and number of deposition cycles in the prior art example.
Figure 9:
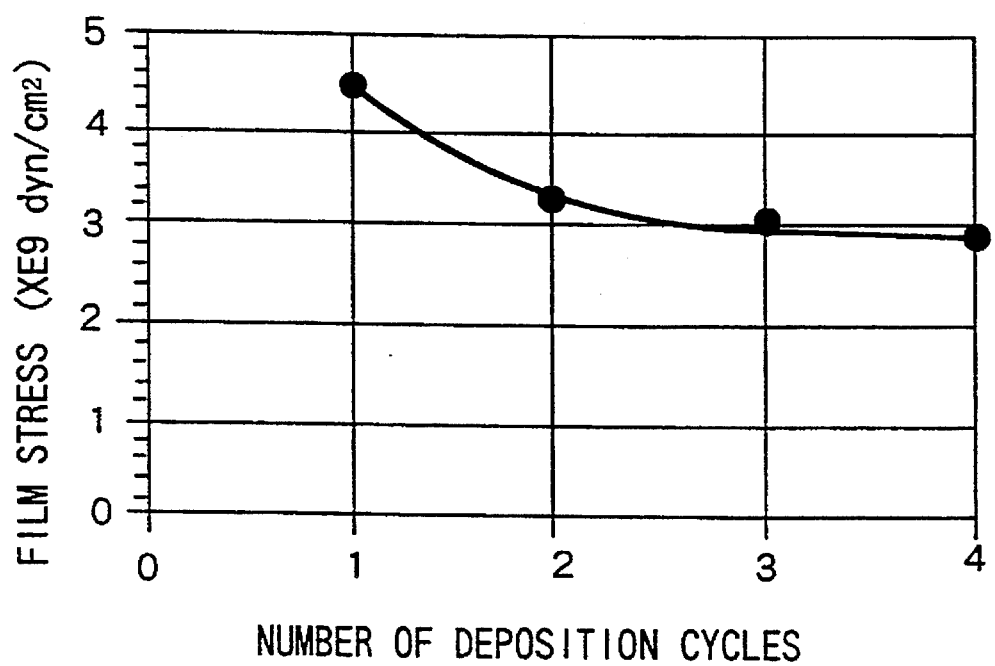
FIG. 9 is a view showing the relation between film stress and number of deposition cycles in the prior art example.

FIG. 3 is a schematic view showing an electrode section of a parallel flat electrode type single substrate processing plasma CVD apparatus used in this embodiment. The parallel flat electrodes are an upper and a lower electrode 1 and 2. A substrate or wafer 3 for CVD film formation thereon is placed on the lower electrode 2. FIG. 3 shows a state right before the commencement of deposition on the wafer 3. In the state of FIG. 3, the intensity $E_x$ of the electric field produced in the space between the parallel flat electrodes is given as $$E_x = E_0 - (E_2 + E_3)$$

where $E_0$ is the electric field intensity in the case of absence of the wafer 3 and CVD film 4, and $E_3$ and $E_4$ are the electric field intensities in the wafer 3 and the CVD film 4, respectiely. In the state shown in FIG. 3, the electric field intensity produced in the space between the parallel flat electrodes is reduced by $E_3$ by the CVD film deposited on the upper electrode 1. $E_3$ is a function of the thickness d3 of the CVD film 4. Specifically, with increase of the thickness d3 the intensity $E_3$ is increased to reduce the intensity of the electric field produced in the space between the parallel flat electrodes. FIGS. 7 to 9 show refractive index, growth rate and film stress data when plasma film deposition is done continuously without electric field correction with the single substrate type plasma CVD apparatus. The data show well the manner of increase of the electric field produced in the space between the parallel flat electrodes as the CVD film 4 is deposited on the upper electrode 1.

In this embodiment, as means for electric field correction for each deposition cycle the peripheral voltage applied between the parallel flat electrodes is increased according to the thickness d3 of the CVD film 4 deposited on the upper electrode 1. It is thus possible to readily and properly make up for the inter-electrode electric field intensity reduction due to deposited films formed on the electrodes during the deposition. Thus, the next deposition cycle can be performed continuously without possibility of resulting in non-uniformity of the film thickness and film quality, such as etching rate, film stress, etc.

With this embodiment, when plasma nitride film deposition is made continuously, the number of deposition cycles, refractive index, growth rate and film stress are substantially in a flat relationship to one another, indicating no change in the deposition status.

Figure 10:
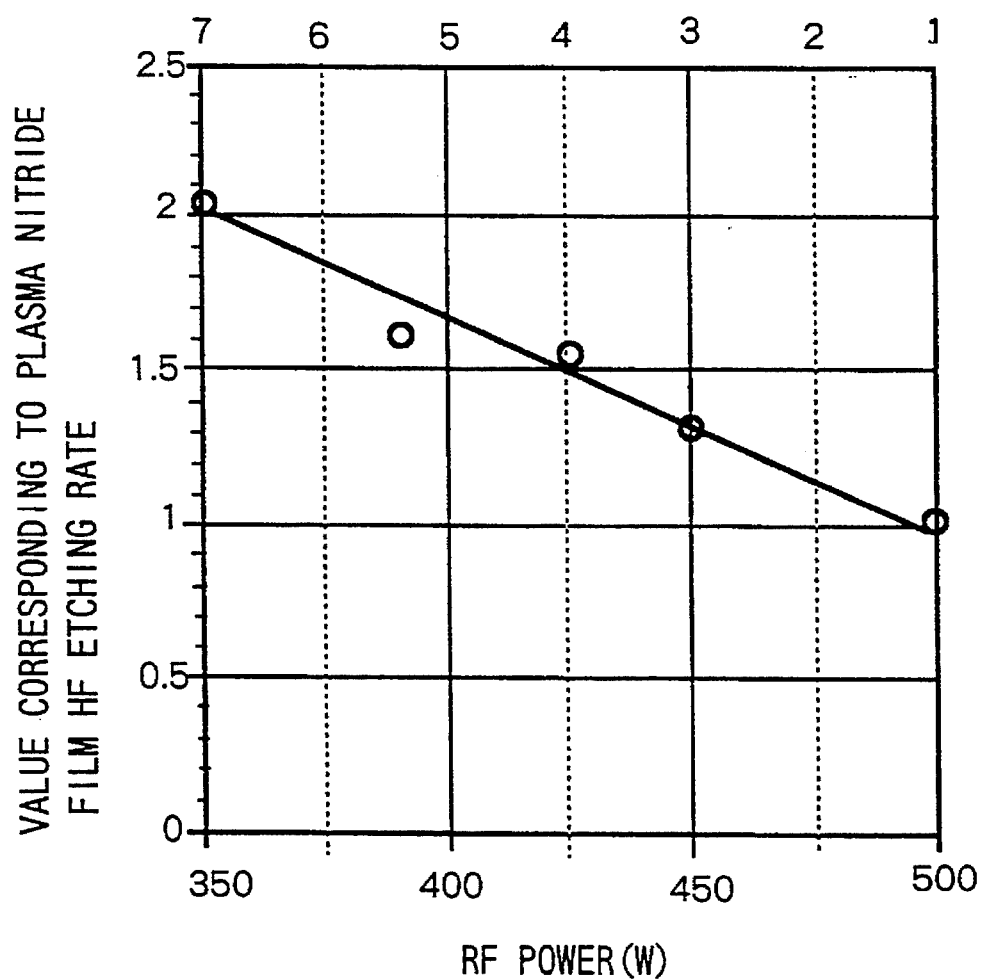
FIG. 10 is a view illustrating a problem in the prior art exmple.

In the prior art, as shown in FIG. 10, when plasma nitride film deposition is made continuously, at a certain film thickness the high frequency etching rate which is an index of the film quality, is reduced with reduction of the interelectrode radio frequency power as shown in the graph.

In this embodiment, the inter-electrode electric field intensity reduction due to the CVD films formed on the electrodes can be made up for, and thus it is possible to satisfactorily obtain the deposition of the next continuous cycle without resulting in non-uniformity of the thickness and quality of the CVD film. Thus, it is possible to realize the cleaning frequency reduction in the process sequence without any problem.

EMBODIMENT 2

In this embodiment, as means for electric field intensity correction for each deposition cycle the distance d1 between the parallel flat electrodes is reduced according to the thickness d3 of the CVD film 4 deposited on the upper electrode 1. Again with this embodiment it is possible to obtain the same functions and effects as in the previous Embodiment 1.

As has been described in the foregoing, according to the invention it is possible to provide a process of plasma deposition which permits increasing the plasma deposition processing capacity.

What is claimed is:

1. A process for plasma deposition using a single substrate processing plasma CVD apparatus having a chamber accommodating an upper electrode and a lower electrode facing the upper electrode and supporting a substrate, said process comprising the steps of:

performing at least two deposition cycles to form a CVD film on said substrate, the intensity of the electric field applied between the upper and lower electrodes being changed for each deposition cycle; and plasma cleaning the chamber after the deposition cycles.

2. The process for plasma deposition according to claim 1, wherein the intensity of the electric field is increased according to the thickness of film deposited on the upper electrode.

3. The process for plasma deposition according to claim 1, wherein the distance between the upper and lower electrodes is reduced according to the thickness of film deposited on the upper electrode.

* * * * *